United States Patent
Stamper (10) Patent No.: US 9,233,832 B2
(45) Date of Patent: Jan. 12, 2016

(54) MICRO-ELECTRO-MECHANICAL SYSTEM (MEMS) STRUCTURES AND DESIGN STRUCTURES

(71) Applicant: INTERNATIONAL BUSINESS MACHINES CORPORATION, Armonk, NY (US)

(72) Inventor: Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/891,294

(22) Filed: May 10, 2013

(65) Prior Publication Data
US 2014/0332913 A1    Nov. 13, 2014

(51) Int. Cl.
| H01H 57/00 | (2006.01) |
| H02N 1/00 | (2006.01) |
| H05K 13/00 | (2006.01) |
| H01H 51/22 | (2006.01) |
| H01G 7/00 | (2006.01) |
| B81B 3/00 | (2006.01) |

(52) U.S. Cl.
CPC ...................................... B81B 3/001 (2013.01)

(58) Field of Classification Search
USPC .................................................. 257/413–423
See application file for complete search history.

(56) References Cited

U.S. PATENT DOCUMENTS

| 5,786,621 | A | 7/1998 | Saif et al. |
| 6,310,403 | B1 | 10/2001 | Zhang et al. |
| 6,720,267 | B1 | 4/2004 | Chen et al. |
| 6,876,282 | B2 | 4/2005 | Andricacos et al. |
| 6,876,482 | B2 | 4/2005 | DeReus |
| 7,283,024 | B2 | 10/2007 | Bar et al. |
| 7,319,580 | B2 * | 1/2008 | Chou ........................ H01G 5/16 361/272 |
| 7,382,039 | B2 | 6/2008 | Hollenbeck et al. |
| 7,554,711 | B2 | 6/2009 | Miles |
| 7,711,239 | B2 | 5/2010 | Sasagawa et al. |
| 7,736,931 | B1 | 6/2010 | Guo |
| 7,758,912 | B2 | 7/2010 | Reboa |
| 2003/0116417 | A1 * | 6/2003 | DeReus ........................ 200/181 |

(Continued)

FOREIGN PATENT DOCUMENTS

| CN | 102035494 | 4/2011 |
| KR | 20090090107 | 8/2009 |

OTHER PUBLICATIONS

Chen et al., "Investigation on Seal-Ring Rules for IC Product Reliability in 0.25-μm CMOS Technology", Microelectronics Reliability; Elsevier, 2005; p. 1311-1316.

(Continued)

*Primary Examiner* — Howard Weiss
*Assistant Examiner* — Nelson Garces
(74) *Attorney, Agent, or Firm* — Anthony Canale; Andrew M. Calderon; Roberts Mlotkowski Safran & Cole, P.C.

(57) ABSTRACT

Dummy Micro-Electro-Mechanical System (MEMS) structures, methods of manufacture and design structures are disclosed. The method includes forming a bumper extending from a Micro-Electro-Mechanical System (MEMS) beam structure provided within a cavity structure. The method further includes forming a dummy landing structure on an opposing side of the cavity structure from the MEMS beam, which is laterally offset from the bumper when the MEMS beam is in a non-actuated state.

20 Claims, 5 Drawing Sheets

(56) References Cited

U.S. PATENT DOCUMENTS

| | | | |
|---|---|---|---|
| 2003/0146079 A1* | 8/2003 | Goldsmith | 200/181 |
| 2005/0007219 A1* | 1/2005 | Ma et al. | 335/78 |
| 2005/0156695 A1 | 7/2005 | Andricacos | |
| 2005/0248424 A1* | 11/2005 | Chou | B81B 3/0072 335/78 |
| 2006/0262380 A1 | 11/2006 | Miles | |
| 2006/0278942 A1 | 12/2006 | Rubel | |
| 2007/0241636 A1 | 10/2007 | Ohguro | |
| 2008/0230909 A1 | 9/2008 | Chilcott | |
| 2010/0001355 A1* | 1/2010 | Peczalski et al. | 257/415 |
| 2010/0072043 A1* | 3/2010 | Bar et al. | 200/181 |
| 2010/0181652 A1 | 7/2010 | Milne et al. | |
| 2012/0319527 A1* | 12/2012 | Jahnes et al. | 310/300 |

OTHER PUBLICATIONS

Y. Rolain, et al., "Substrate Noise Coupling in Analog/RF Systems", Jun. 2009, Vrije Universiteit Brussel; 253 Pages.

International Search Report and Written Opinion for related PCT Application No. PCT/IB2014/060145 dated Nov. 17, 2014, 10 pages.

* cited by examiner

MICRO-ELECTRO-MECHANICAL SYSTEM (MEMS) STRUCTURES AND DESIGN STRUCTURES

FIELD OF THE INVENTION

The invention relates to semiconductor structures and methods of manufacture and, more particularly, to dummy Micro-Electro-Mechanical System (MEMS) structures, methods of manufacture and design structures.

BACKGROUND

Integrated circuit switches used in integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs) and their low insertion loss (i.e., resistance) at frequencies of 10 GHz and higher. MEMS switches can be used in a variety of applications, primarily analog and mixed signal applications. One such example is cellular telephone chips containing a power amplifier (PA) and circuitry tuned for each broadcast mode. Integrated switches on the chip would connect the PA to the appropriate circuitry so that one PA per mode is not required.

MEMS can be realized in the form of a cantilever or bridge structure. In the cantilever structure, a cantilever arm (suspended electrode) is pulled toward a fixed electrode by application of a voltage. Cantilevers are supported on one end and bridges are supported on both ends. The voltage required to pull the suspended electrode to the fixed electrode by electrostatic force is called pull-in voltage, which is dependent on several parameters including the length of the suspended electrode, spacing or gap between the suspended and fixed electrodes, and spring constant of the suspended electrode, which is a function of the materials and their thickness.

MEMS can be manufactured in a number of ways using a number of different tools. In general, though, the methodologies and tools are used to form small structures with dimensions in the micrometer scale with switch dimensions of approximately 5 microns thick, 100 microns wide, and 200 microns long. Also, many of the methodologies, i.e., technologies, employed to manufacture MEMS have been adopted from integrated circuit (IC) technology. For example, almost all MEMS are built on wafers and are realized in thin films of materials patterned by photolithographic processes on the top of the wafer.

SUMMARY

In an aspect of the invention, a method comprises forming a bumper extending from a Micro-Electro-Mechanical System (MEMS) beam structure provided within a cavity structure. The method further comprises forming a dummy landing structure on an opposing side of the cavity structure from the MEMS beam, which is laterally offset from the bumper when the MEMS beam is in a non-actuated state.

In an aspect of the invention, a method comprises determining a size and/or location offset of a dummy landing structure with respect to a bumper by accounting for at least one of process variations of fabricating a MEMS structure and affects of operating conditions on the MEMS structure.

In an aspect of the invention, a structure comprises a MEMS structure comprising a bumper extending from a MEMS beam and dummy landing structure aligned with the bumper at any given operating temperature during actuation of the MEMS beam at any given operating temperature.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the Electro-Mechanical System (MEMS) structures, which comprises the structures of the present invention. In still further embodiments, a method in a computer-aided design system is provided for generating a functional design model of the MEMS structures. The method comprises generating a functional representation of the structural elements of the MEMS structures.

More specifically, in embodiments, a hardware description language (HDL) design structure is encoded on a machine-readable data storage medium. The HDL design structure comprises elements that when processed in a computer-aided design system generates a machine-executable representation of a MEMS structure. The system generates a MEMS structure comprising a bumper extending from a MEMS beam and dummy landing structure aligned with the bumper at any given operating temperature during actuation of the MEMS beam at any given operating temperature.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to dummy Micro-Electro-Mechanical System (MEMS) structures, methods of manufacture and design structures. More specifically, the present invention relates to a MEMS structure comprising a dummy landing structure aligned with an oxide bumper at any given MEMS beam residual stress or operating temperature and during operation of the MEMS beam. The MEMS beam residual stress can vary with operating temperature since the materials composing the MEMS beam, i.e., insulators and metals, have coefficient of thermal expansion (CTE) differences which cause the residual stress of the MEMS beam to vary with operating temperature. In embodiments, the dummy landing structure of the present invention can be an offset dummy actuator shape, which can account for both variability in the nominal offset due to stress/thickness/width variation and temperature-induced stress changes in the MEMS beam, to name a few variables. In embodiments, the dummy landing structure can be widened (or provided in other shapes and sizes) to take into account MEMS beam offset due to MEMS variability and temperature-induced stress changes in the MEMS beam.

It has been discovered that stresses in the MEMS beam will drive an offset of the MEMS beam after release and/or during operation, thereby increasing the chances that an oxide bumper on the MEMS beam will not land properly on a dummy landing structure, typically composed of a metal or metal alloy embedded within a substrate, e.g., interlevel dielectric material. These offsets in the MEMS beam have been found to be residual stress and/or temperature dependent, primarily due to the non-zero stress of the beam layers and to mismatches in thermal coefficients of metals and oxides used in the fabrication process of the MEMS beam.

Also, it has been found that a MEMS beam may shift or even distort, based on different variables such as temperature, residual beam residual stress, lithographic overlay, dimensions and type of the beam (cantilever vs. bridge beam) and other variations in the process flow, design of the structures and operating conditions, all of which were not previously known to affect the stiction of the MEMS beam under actuation. MEMS beam stiction during actuation can be caused by charging and results in a functional or reliability fails of the MEMS beam because it is stuck in the down position. For example, distortions or shifting of the MEMS beam have been found to be affected by, amongst other conditions across wafer or wafer-to-wafer:

residual beam residual stress is unequal to zero;
residual beam stress variability;
lithographic overlay and width tolerance;
temperature-induced change in MEMS beam shape due to changes in temperature-dependent residual stresses of the oxide and meal films;
operating ambient or conditions of the MEMS structure; and/or
types of beams, including dimensions and the use of lateral springs, which affect the beam spring constant and other mechanical properties.

Advantageously, the present invention has been found to improve the resistance of actuated MEMS beam stiction of the MEMS structure, taking into account these previously unknown contributors to misalignment of the bumpers of the MEMS beam. It is noteworthy that prior to the present invention, MEMS beam resistance to actuated stiction issues were not identified as being affected by the above variables and systemic changes due to process flows. In fact, the dummy shape and oxide bumper would ordinarily be aligned based solely on the pre-actuation locations of these structures, without taking into consideration process conditions, beam type, e.g., cantilever, bridge, etc., spring constants of the beam, shifting of the beams during actuation, MEMS beam residual stress, temperature-induced changes in beam film stress, and other process and operating conditions, etc.

Accordingly, the inventors not only have identified such problems, e.g., misalignment of bumpers and underlying dummy landing structures during different operating conditions of the MEMS beam, but also have provided solutions to these problems of misalignment of a bumper with the dummy landing structure. For example, by taking into consideration the above noted contributors to misalignment, the present invention ensures that the bumper, on the MEMS beam, aligns with the dummy landing structure during operation and regardless of residual stress variability, lithographic misalignment, temperature changes, etc., thereby achieving significant improvement in actuated beam lifetime. For example, the actuated MEMS beam lifetime of the MEMS structure of the present invention provides upwards of a factor of 5× improvement compared to when oxide bumpers do not land on a dummy landing structure.

Accordingly, the present invention takes into consideration these different variables (process variations and/or operating conditions) and how they affect the landing of a MEMS beam on a dummy landing structure when fabricating the MEMS structures, e.g., dummy landing structure. In this way, the dummy landing structure can be assured to align with the bumper of the MEMS beam. That is, the present invention takes into account these systemic changes and the affects thereof, when designing and fabricating the dummy landing structure. In this way, it is possible to increase the size and/or relocate (e.g., laterally offset) the dummy landing structure with respect to a bumper on the MEMS beam, taking into account temperature and stress-induced beam X Y offsets and/or other process variations and operating conditions.

Figure 1:
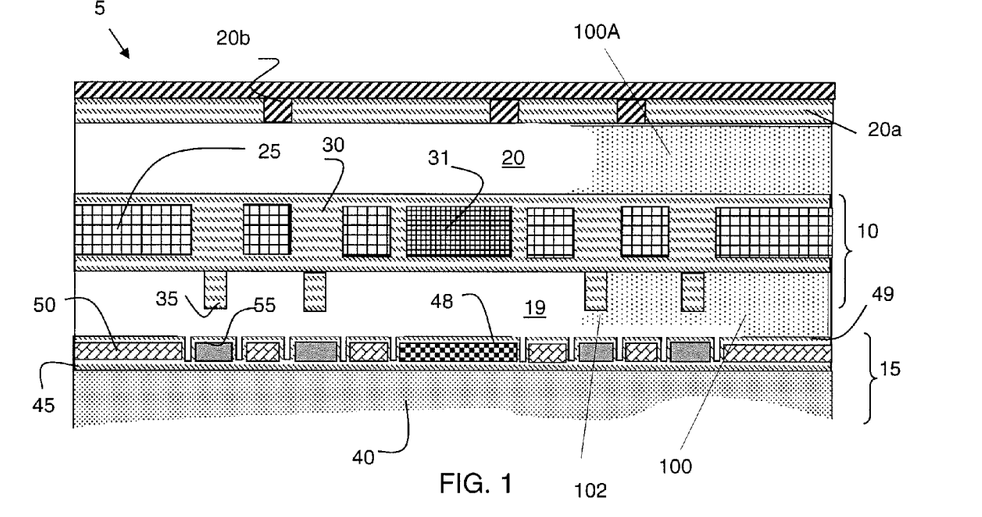
FIG. 1 shows processing steps and a respective structure in accordance with aspects of the present invention.

FIG. 1 shows a cross section of a MEMS structure and respective fabrication processes in accordance with aspects of the present invention. In embodiments, the MEMS structure can be, for example, any MEMS device such as, for example, a MEMS capacitor, an ohmic switch, MEMS accelerometer, or any MEMS device which uses fixed electrodes and an actuator. In addition, the MEMS structure of the present invention can be used, for example, as a single or dual wire beam contact switch, dual wire beam capacitor switch, or single dual wire beam air gap inductor, amongst other devices. The MEMS structure of the present invention can be a cantilever beam structure or a bridge beam, for example.

As discussed below in more detail, the MEMS structure can be manufactured using CMOS technologies with a number of different tools. In general, though, the methodologies and tools are used to form small structures with dimensions in the micrometer scale with switch dimensions of approximately 5 μm thick, 100 μm wide, and 400 μm long. These methodologies consist of three basic building blocks: (i) deposition of thin films of material on a substrate, (ii) applying a patterned mask on top of the films by photolithographic imaging, and (iii) etching the films selectively to the mask. For example, in MEMS cantilever type switches, the electrodes and actuators are manufactured using a series of conventional photolithographic, etching and deposition processes.

More specifically and still referring to FIG. 1, the MEMS structure 5 includes a MEMS beam 10, formed over a substrate 15. In embodiments, the MEMS beam 10 is separated from the substrate 15 by a lower cavity structure 19 and an upper cavity structure 20 which can be formed in any conventional manner, e.g., by venting a sacrificial material, e.g., silicon or spin-on polymer PMGI, through vent holes 20b formed in an upper dielectric lid material 20a. It should also be understood by those of ordinary skill in the art that the cavity structures 19 and 20 are also provided above, below, and around the MEMS beam 10 to allow for it to move vertically when actuated.

In one example, prior to and after the formation of the MEMS beam 10, a layer of sacrificial material 100, e.g., silicon, is deposited under the MEMS structure, to form a cavity (as representatively shown in FIG. 1), and over the MEMS structure as shown by material 100A in FIG. 1, to form a cavity 19, 20, respectively. The cavity over the MEMS structure is used to support the formation of a cap, e.g., $SiO_2$ and SiN dome (upper dielectric lid material 20a), to seal the MEMS structure after the sacrificial material is removed. After the dome is formed, vent holes 20b are provided in the dome 20a using conventional etching processes, e.g., RIE. The sacrificial material is then vented through the vent holes 20b using, for example, $XeF_6$ as representatively shown in FIG. 1. Once the sacrificial material is vented, the dome can be hermetically sealed by, for example, sequentially deposited oxide and nitride materials which seal off the vent holes and deposit on top of the dome 20a, all of which is represented by reference numeral 20b.

By way of further illustrative examples, the MEMS beam 10 can be a single wire, a damascene wire in oxide, metal/oxide/metal, oxide/silicon/oxide, etc., all of which are known to those of skill in the art. In embodiments, electrodes 25 and capacitor plate 31 are formed in an oxide or other insulator material 30 of the MEMS beam 10 by conventional CMOS processes, e.g., lithography, etching and deposition methods. For example, the electrodes 25 and capacitor plate 31 can be formed by either an additive process or a subtractive process. Illustratively, in a subtractive process, the electrodes 25 and capacitor plate 31 can be formed by depositing a metal layer on an insulator material, e.g., material 30, and patterning the metal layer using conventional photolithographic and etching (e.g., reactive ion etching (RIE)) processes. The metal layer can be any conductive metal or alloy thereof. For example, the metal layer can be, for example, copper or aluminum or alloys thereof. In embodiments, the electrodes 25 and capacitor plate 31 can have a thickness of about 1 micron to about 3 microns; although other dimensions are also contemplated by the present invention.

After patterning, an additional layer of insulator material 30 is formed over the electrodes 25 and capacitor plate 31, completing the MEMS beam 10. In embodiments, the additional layer of insulator material 30 can be polished, e.g., using a chemical mechanical polishing (CMP). A sacrificial material can then be formed over the additional layer of insulator material 30, which will be vented in later processing steps to form the upper portion of the cavity 20.

To compensate for stiction, a bumper 35 is formed on the MEMS beam 10, near the electrodes 25. In embodiments, the bumper 35 can be an oxide bumper, such as, for example, $SiO_2$ (oxide) or other material extending downward from the MEMS beam 10. Alternatively, the bumper 35 can extend upwards from a fixed electrode 50 under the MEMS beam 10 (when the fixed electrodes and dummy landing structure are formed above the MEMS beam, as discussed in more detail below). The bumper 35 should be located and have a thickness and width to avoid substantially decreasing capacitance and to reduce or eliminate actuator contact.

In embodiments, the bumper 35 is about 0.1 to 1 micron wide and 10-250 nm thick and, in one exemplary embodiment, about 0.5 micron wide and 50 nm thick. In embodiments, the bumper 35 can be formed by depositing an insulator material 30 within a recess 102 formed in an underlying sacrificial material 100 used to form the lower portion of the cavity 19. Upon venting of the cavity, the bumper 35 will form on an underside of the MEMS beam 10. This process can be used regardless of the type of materials used to form the remaining portions of the MEMS beam 10.

Still referring to FIG. 1, the substrate 15 includes a dielectric layer 45 formed on an underlying layer 40. The underlying layer 40 can be composed of a host of materials, depending on the level of the device. For example, the underlying layer 40 can be a BULK substrate or a semiconductor material, if SOI technologies are being utilized with the present invention. The dielectric layer 45 can be an oxide material ($SiO_2$) or any known interlevel dielectric such as, spin-on glass, SiCOH, SiN, polyimide, etc. In embodiments, fixed electrodes 50, lower capacitor plate 48, and dummy landing structure 55 are formed within the dielectric layer 40. In embodiments, the fixed electrodes 50, lower capacitor plate 48, and dummy landing structure 55 are formed in the same processes, either by an additive or subtractive process using metal or metal alloys known to be used for such structures. The fixed electrodes 50, lower capacitor plate 48, and dummy landing structure 55 can also be formed on a surface of the dielectric layer 45 and, in embodiments, can be coated in an insulator such as oxide layer 49.

In embodiments, the dummy landing structure 55 is aligned with the bumper 35, taking into consideration the affects of the process variations and operational conditions of the MEMS beam 10. For example, the dummy landing structure 55 can be initially fabricated in an offset relationship to the bumper 35 such that, after release and upon actuation and under different operating conditions of the MEMS beam, the dummy landing structure 55 will align with the bumper 35 regardless of operating temperatures, etc. It should be understood by those of skill in the art that the fixed electrodes 50 and dummy landing structure 55 can be provided on a top of the MEMS beam. In such an alternative process, the bumper 35 can be located at a top surface of the MEMS beam 10.

In more specific embodiments, the dummy landing structure 55 can be offset from the bumper 35 to take into account variability in the nominal offset due to stress/thickness/width variation and temperature-induced stress changes in the MEMS beam 10, amongst other process variables and operating conditions that affect the landing of the oxide bumper. In addition, in embodiments, the spacing between the actuator 50 and the dummy landing 55 can be increased to account for tolerance in the bumper 35 landing location in the actuated MEMS beam 10. For example, with a beam length of 420 μm, the lateral offset can be about 0.8+/−0.4 μm and the actuator 50 to dummy landing 55 offset could be 0.8 microns.

In embodiments, the dummy landing structure 55 can also be widened (or provided in other shapes and sizes) or offset to take into account MEMS beam offset due to MEMS variability and temperature-induced stress changes in the MEMS beam. For example, the dummy landing structure 55 can also be widened or made larger in another dimension, with respect to the bumper 35; that is, the dummy landing structure 55 can be made larger than the bumper 35. By way of example, the dummy landing structure can be made larger than the bumper 35 by a factor of about 1.5×.

In additional or alternative embodiments, the dummy landing structure 55 can be located at a position to compensate for the shifting of the MEMS beam 10, depending on whether it is a cantilever beam or a bridge beam, for example. Accordingly, as should now be understood, the dummy landing structure 55 is designed, located and structured to take into account any MEMS beam shift or beam distortion and extended landings (due to temperature variation-induced beam distortion changes) when the MEMS beam 10 is actuated, i.e., in contact with the fixed actuator level (e.g., substrate 15), based on different variables such as temperature, residual beam residual stress, lithograph overlay, dimensions and type of the beam (cantilever vs. bridge beam) and other variations in the process flow, design and operational conditions of the MEMS beam 10.

Figure 2A:
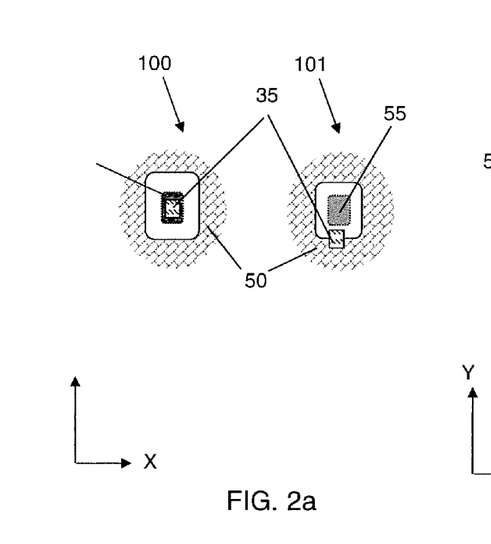
FIGS. 2a and 2b show a comparison of two structures during different operating conditions in accordance with the present invention.
Figure 2B:
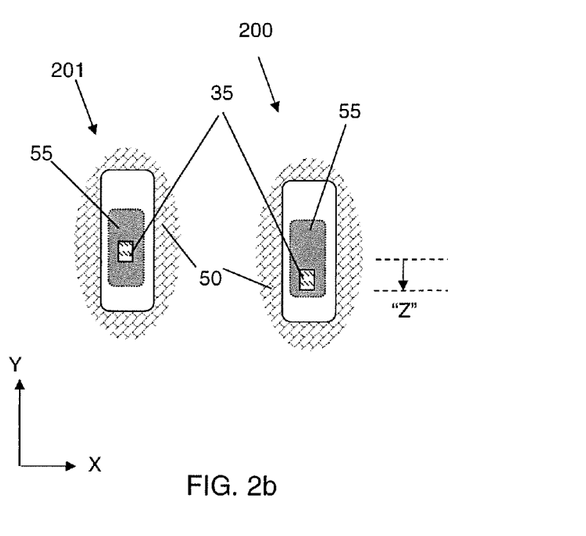

FIGS. 2a and 2b show a top view comparison of two structures in accordance with the present invention. In particular, FIG. 2a shows a top view of a structure 100 that does not compensate for the operational and processing variations as discussed herein; whereas, FIG. 2b shows a structure 200 that takes into consideration operational and processing variations. In this example, the structure 200 is representative of the processes and final structure of the present invention. This representation assumed a beam offset of about 0.8 µm in the "Y" direction; although it is understood that the beam offset could be in both the "X" and "Y" direction. As seen in FIG. 2a for structure 100, the bumper 35 of the conventional structure has a dummy landing structure 55 initially aligned with the bumper 35 (e.g., a center point of the dummy landing structure 55 and the bumper 35 are aligned along the XY coordinates as the structure was designed), prior to release or actuation of the beam structure 10. After release, the MEMS beam can move laterally due to a variety of factors including stress gradients, and, once actuated, the MEMS beam will move downward towards the dummy landing structure 55; however, due to the operational offset that occurs in the beam, the dummy landing structure 55 and the bumper 35 are no longer aligned. At best, they may partially overlap, although complete misalignment due to lateral displacement of the MEMS beam 10 during actuation is known to occur as shown by structure 101. For the actuated case in structure 101, the MEMS beam actuator and the fixed electrode actuator 50 are in direct contact through the oxide bumper 35, which can result in a high electric field during actuation between the two actuators and stiction fails due to surface charging.

In contrast, in FIG. 2b, prior to actuation of the MEMS beam, the dummy landing structure 55 of the structure 200 is laterally offset by a calculated distance "X", with respect to the bumper 35; that is, a center point of the dummy landing structure 55 and the bumper 35 are offset by a distance "Z" in the X and/or Y coordinates). In this way, upon actuation, the bumper 35 will land directly on the dummy landing structure 55, i.e., the bumper 35 and the dummy landing structure 55 are aligned as shown in structure 201.

Figure 3:
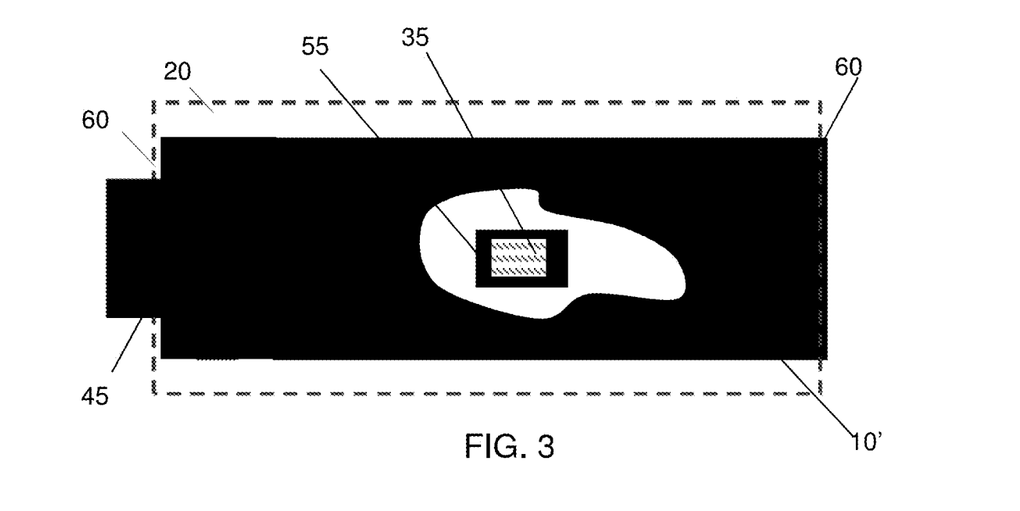
FIG. 3 shows an illustrative beam structure in accordance with aspects of the present invention.

FIGS. 3-5b show illustrative beam structures in accordance with aspects of the present invention. In embodiments, the beam structures of FIGS. 3-5b will have XY tolerances due to misalignment, etch bias variability, etc. This, for example, can be on the order of +/−0.2 um. In embodiments, the illustrative beam structure 10' of FIG. 3 is shown to be formed in a cavity 20, and attached at its ends 60 to the interlevel dielectric material 45. The illustrative bridge beam structure 10' can have variations in its length and its width, as well as exhibit stress and lateral shift during operation. For example, in embodiments, the width tolerance of the illustrative beam structure 10' can be +/−0.2 microns.

Figure 4:
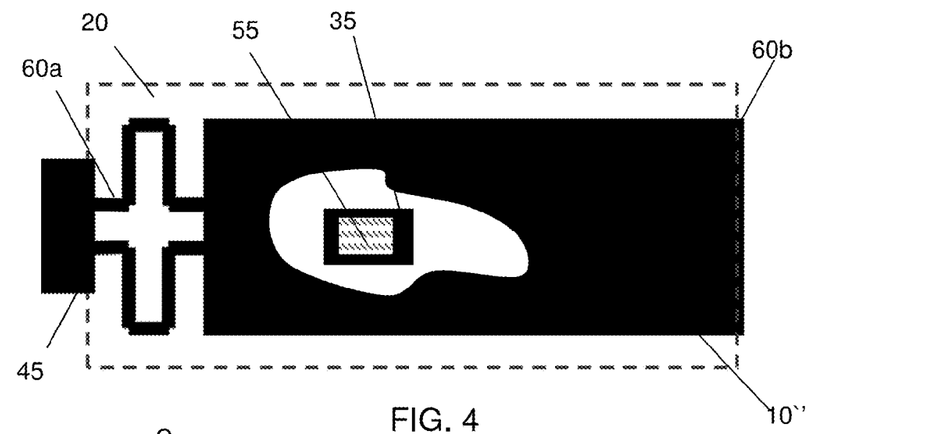
FIGS. 4, 4a and 4b show an illustrative bridge beam structure with a spring at one end, in accordance with aspects of the present invention.
Figure 4A:
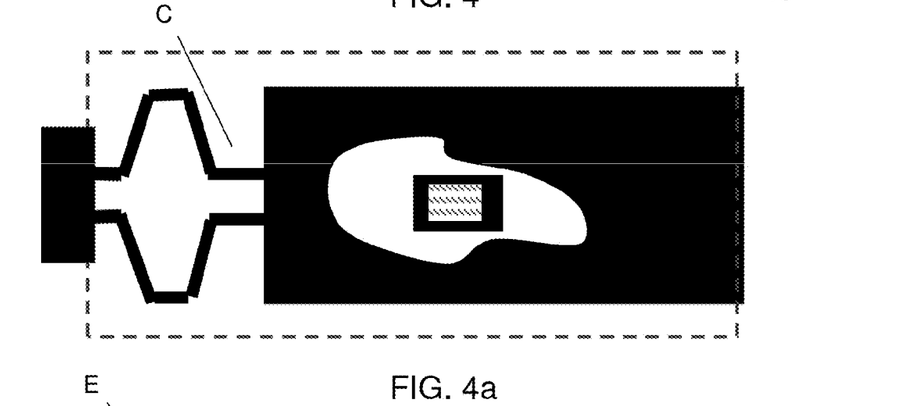
Figure 4B:
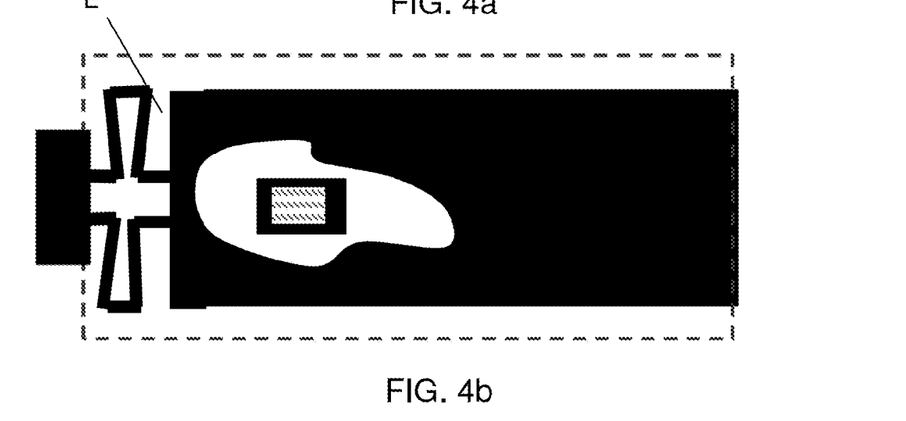

Referring to FIGS. 4, 4a and 4b, the illustrative bridge beam structure 10'' can be a loop spring provided at one end 60a, and fixed at end 60b, with a variation in it length and its width. As described herein, the illustrative bridge beam structure 10'' of FIGS. 4, 4a and 4b can elongate under tension or compression at the spring ends of the beam due to stress gradients or non-zero residual stress in the MEMS beam and change in size under compression or tension. That is, the beam can stretch near the spring due to either a vertical stress gradient in the beam or to residual stress in the beam, which can be temperature depending. For example, the illustrative bridge beam structure 10''can reduce in size under compression (as shown at reference "C" in FIG. 4a) and elongate under tension (as shown at reference "E" in FIG. 4b). As the illustrative bridge beam structure 10'' as shown in FIGS. 4, 4a and 4b is fixed at one end 60b, the expansion or contraction will be greatest at the spring 60a and zero at end 60b. In this configuration, the dummy landing structure 55 was designed, located and/or structured to take into account such processing and operation variations, etc. In this way, the dummy landing structure 55 and the bumper 35 will be aligned, when the MEMS beam 10'' is actuated, regardless of temperature conditions, stresses, etc.

Figure 5:
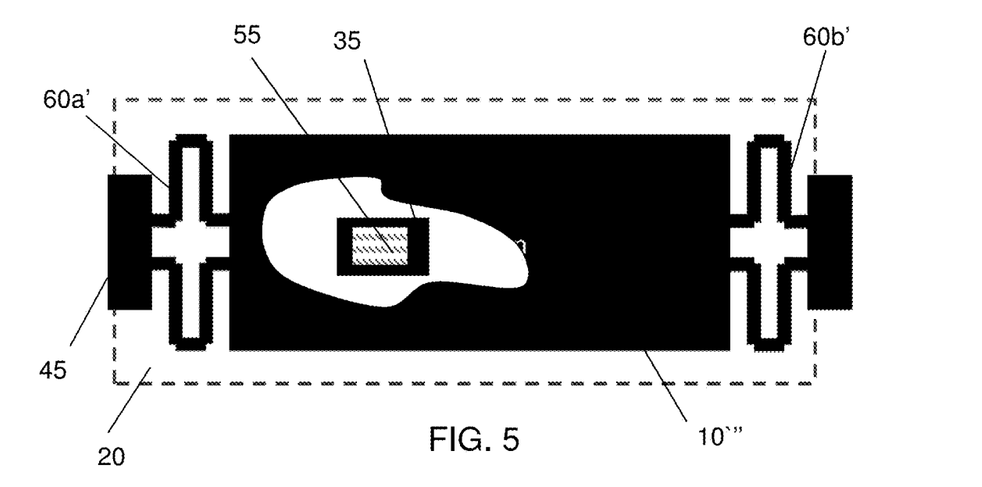
FIGS. 5, 5a and 5b show an illustrative bridge beam structure with a spring at both ends, in accordance with aspects of the present invention.
Figure 5A:
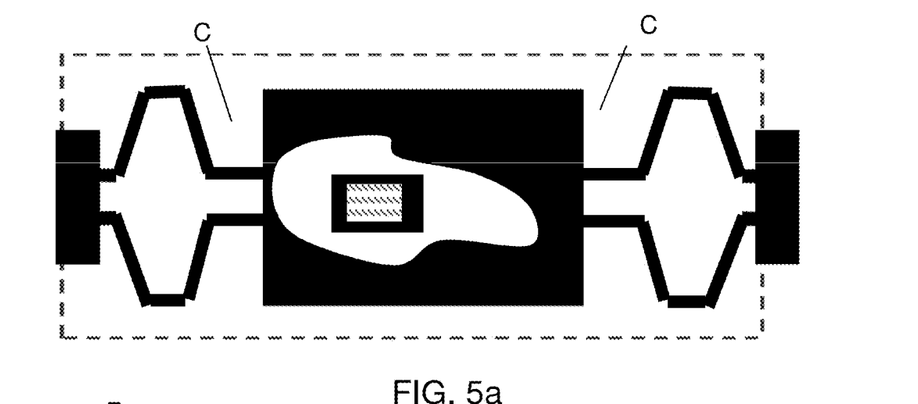
Figure 5B:
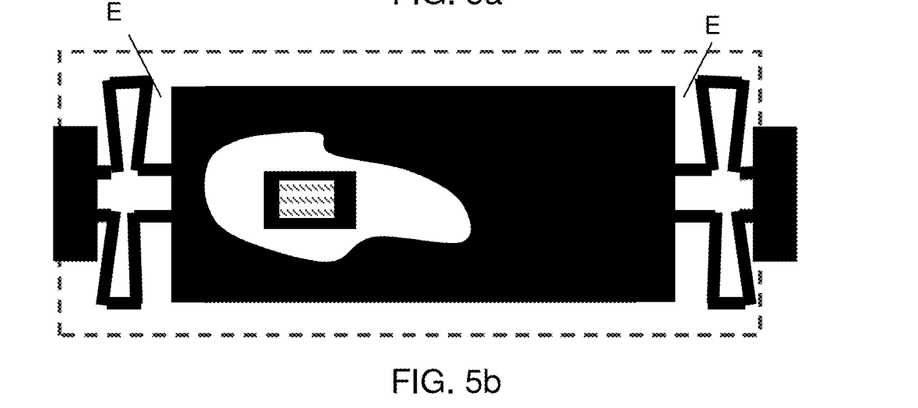

Similarly, the illustrative bridge beam structure 10''' of FIGS. 5, 5a and 5b can elongate under tension or compression at the spring ends of the beam due to stress gradients or non-zero residual stress in the MEMS beam and change in size under compression or tension. In FIGS. 5, 5a and 5b, both of the ends of the illustrative bridge beam structure 10''' are connected to springs 60a' and 60b'. The illustrative bridge beam structure 10''' can reduce in size under compression (as shown at reference "C" in FIG. 5a) and elongate under tension (as shown at reference "E" in FIG. 5b). However, unlike the structure shown in FIGS. 4, 4a and 4b, both springs can expand or contact, so the maximum contraction and expansion is at the spring and the minimum is in the center of the beam. In this configuration, the dummy landing structure 55 was designed, located and/or structured to take into account such processing and operation variations, etc. In this way, the dummy landing structure 55 and the bumper 35 will be aligned, when the MEMS beam 10''' is actuated, regardless of temperature conditions, stresses, etc.

Accordingly, as discussed above for any of the embodiments, the beam can stretch near the spring due to either a vertical stress gradient in the beam or to residual stress in the beam, which can be temperature depending. This residual stress or stress gradient can put either a tensile or compressive stress on the beam. When the released beam is under stress, it will expand (tension) or contract (compression) the spring. Moreover, it has been found that the illustrative bridge beam structure 10' of FIG. 3 exhibits minimal to no offset due to stress gradients or non-zero residual stress, whereas, due to the spring effect for FIGS. 4-5b, the offset is maximum at the spring ends (i.e., end 60a in structure 10'' and both ends 60a and 60b in structure 10''').

Due to the affects of the different operating and processing conditions, the dummy landing structure 55 was designed, located and/or structured to take into account such processing and operation variations, etc. In this way, the dummy landing structure 55 and the bumper 35 of the illustrative cantilever beam structure 10' will be aligned when the MEMS beam is actuated, regardless of temperature conditions, stresses, etc. More specifically, by way of example, the fabrication processes of the present invention will offset the dummy landing structure 55 by about 0.8+/−0.4 µm with respect to the bumper 35 (when the MEMS beam is in an non-actuated state), to compensate for the affects resulting from the following processing variations and operational conditions:

beam residual stress variability (which can result in an offset and/or distortion of approximately +/−15%→+/−0.12 µm lateral shift of the beam);

lithographic overlay and width tolerance (which can result in an offset and/or distortion of approximately +/−0.15 µm); and/or temperature changes of about +/−65° C. for a 420 µm long beam (which can result in an offset and/or distortion of approximately +/−0.2 µm).

Figure 6:
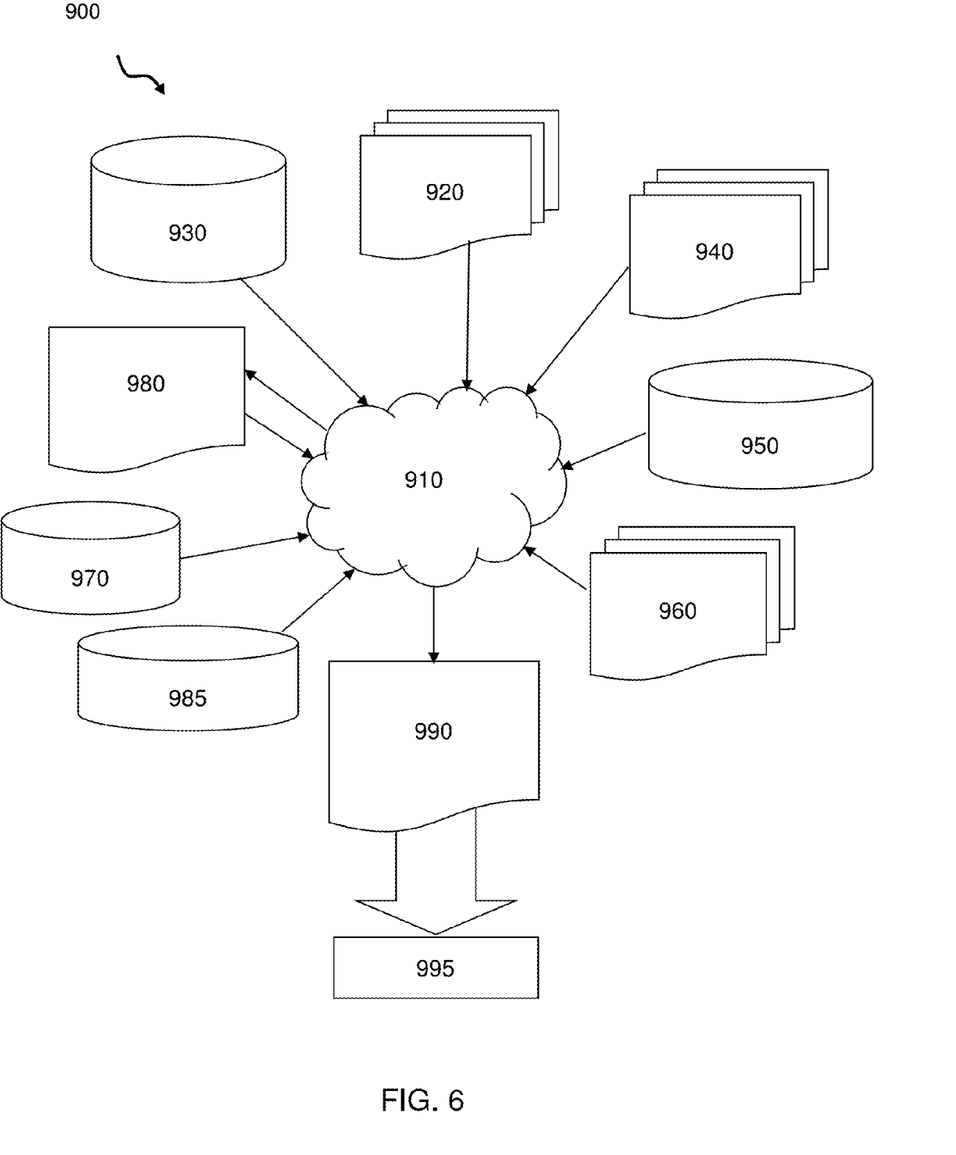
FIG. 6 is a flow diagram of a design process used in semiconductor design, manufacture, and/or test.

FIG. 6 is a flow diagram of a design process used in semiconductor design, manufacture, and/or test. FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2b, 3, 4, 4a, 4b, 5, 5a and 5b. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2b, 3, 4, 4a, 4b, 5, 5a and 5b. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2b, 3, 4, 4a, 4b, 5, 5a and 5b to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2b, 3, 4, 4a, 4b, 5, 5a and 5b. In one embodiment, design structure 990 may comprise a compiled, executable HDL simulation model that functionally simulates the devices shown in FIGS. 1, 2b, 3, 4, 4a, 4b, 5, 5a and 5b.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2b, 3, 4, 4a, 4b, 5, 5a and 5b. Design structure 990 may then proceed to a stage 995 where, for example, design structure 990: proceeds to tape-out, is released to manufacturing, is released to a mask house, is sent to another design house, is sent back to the customer, etc.

Figure 7:
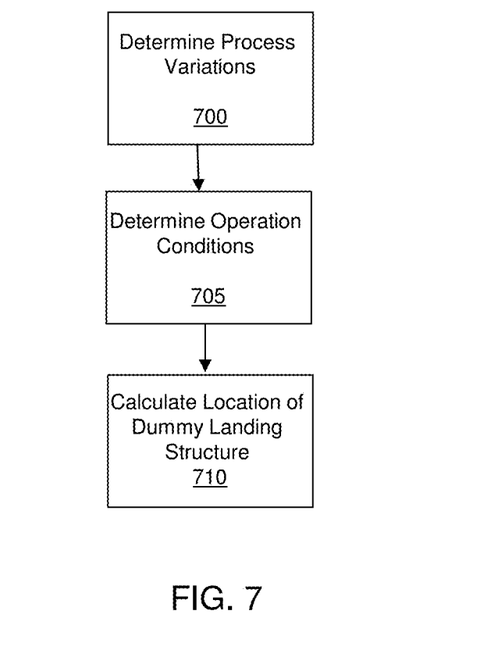
FIG. 7 shows a flow diagram implementing steps in accordance with aspects of the present invention.

FIG. 7 shows a flow diagram, taking into account/considerations the factors required for fabricating the MEMS structure in accordance with the present invention. It will be understood that each block of the flow diagram can be implemented by computer program instructions executed on a computing device. These computer program instructions may be provided to a processor of a general purpose computer, special purpose computer, or other programmable data processing apparatus for implementing the functions/acts specified in the flow diagram. It should also be noted that, in some alternative implementations, the functions noted in the block may occur out of the order noted in the figures. Furthermore, the computer program instructions may be provided on computer-usable or computer-readable medium providing program code for use by or in connection with a computer or any instruction execution system. For the purposes of this description, a computer-usable or computer readable medium can be any apparatus that can contain or store the program for use by or in connection with the instruction execution system, apparatus, or device. The medium can be an electronic, magnetic, optical, electromagnetic, infrared, or semiconductor system (or apparatus or device). Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

More specifically, at step 700, the processes of the present invention review process flows for forming the MEMS structure. For example, the processes of the present invention will determine and/or take into consideration and/or account for, amongst other factors:

the materials used to fabricate the MEMS structure;
the dimensions of the beam, e.g., thickness, length, width, etc.;
the spacing of the beam away from the dummy landing structure;
the dimensions and location of the bumper;
the design of the beam, e.g., cantilever beam, bridge beam, etc.;
the variations in processing conditions, e.g., variations in processing temperatures, material deposition, lithographic overlay and width tolerance, location of the bumper, etc.;
mismatches in thermal coefficients of metals used in fabrication process of the MEMS beam; and/or
the spring constant of the beam, etc.

In step 705, the processes of the present invention will analyze the operating conditions of the beam. This may include the acceleration of the beam, actuation voltage, travel distance of the beam during operation, operating temperatures, cycle times, stress placed on the beam due to a pulling or pushing force (tensile or compressive forces), lateral offset conditions, etc. In step 710, these different process variations and operational conditions are used to calculate an offset and/or shape of the dummy landing structure. For example, movement and/or placement and/or location of the beam and, more particularly, the bumper can be calculated with a high degree of predictability as evidenced by the data provided herein. That is, the processes of the present invention can calculate the landing point of the bumper during operation of the beam, under certain temperature conditions with a high degree of predictability. Using this information, the processes of the present invention can then calculate the position of the dummy landing structure at a certain, predetermined location, in order to ensure proper alignment and landing of the bumper thereon. This calculated offset is then used for the fabrication of the dummy landing structure of the present invention, to ensure alignment with the bumper during any operating temperature of the MEMS structure.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
forming a bumper extending from a Micro-Electro-Mechanical System (MEMS) beam structure provided within a cavity structure; and
forming a dummy landing structure on an opposing side of the cavity structure from the MEMS beam, which is laterally offset in a horizontal direction from the bumper when the MEMS beam is in a non-actuated state and which the bumper lands on when the MEMS beam is in an actuated state.

2. The method of claim 1, wherein the bumper is a dielectric bumper and the dummy landing structure is a metal or metal alloy.

3. The method of claim 2, wherein the metal or metal alloy dummy landing structure is coated in dielectric material.

4. The method of claim 1, wherein:
the forming of the dummy landing structure comprises determining beam distortion and extended landings caused by thermal coefficient mismatch of materials during operating conditions; and
the forming of the dummy landing structure comprises accounting for mismatches in thermal coefficients of materials used in fabrication process of the MEMS beam.

5. The method of claim 1, wherein the forming of the dummy landing structure comprises accounting for variability in nominal offset due to stress/thickness/width variation due to process variations in MEMS beam structure.

6. The method of claim 1, wherein the forming of the dummy landing structure comprises accounting for at least one processing condition of a fabrication process for the MEMS beam or other MEMS structures.

7. The method of claim 6, wherein the at least one processing condition of the fabrication process comprises at least one of variations in material deposition used to form the MEMS beam, lithographic overlay and width, thickness, residual stress tolerance, and location of the bumper.

8. The method of claim 1, wherein the forming of the dummy landing structure comprises accounting for offset due to MEMS variability and temperature-induced stress changes in the MEMS beam.

9. The method of claim 1, wherein the forming of the dummy landing structure comprises accounting for lateral movement of the MEMS beam caused by beam residual stress variability due to a tensile or compressive force.

10. The method of claim 9, wherein the types of MEMS beam includes accounting for dimensions and spring constants of the MEMS beam.

11. The method of claim 9, wherein the forming of the dummy landing structure further comprises accounting for at least one of travel distance of the MEMS beam, acceleration of the MEMS beam, spacing of the MEMS beam away from the dummy landing structure, spring constant of the MEMS beam, actuation voltage, operating temperatures, and cycle times.

12. The method of claim 1, wherein the forming of the dummy landing structure further comprises forming the dummy landing structure larger than the bumper.

13. The method of claim 1, wherein the forming of the dummy landing structure further comprises forming the dummy landing structure in alignment with the bumper when the MEMS beam is fully actuated.

14. The method of claim 1, wherein the forming of the dummy landing structure further comprises forming the dummy landing structure at an offset of approximately 0.8+/− 0.4 μm.

15. A method comprising determining a size and/or location offset of a dummy landing structure with respect to a bumper of insulator material by accounting for at least one of process variations of fabricating a MEMS structure and affects of operating conditions on the MEMS structure such that the bumper always lands on the dummy landing structure and does not contact an actuator of the MEMS structure during actuation.

16. The method of claim 15, wherein the operating conditions comprise at least temperature changes of a MEMS beam of the MEMS structure and beam residual stress variability placed on the MEMS beam during operation.

17. The method of claim 16, wherein the beam residual stress variability results in an offset and/or distortion of the MEMS beam.

18. The method of claim 15, wherein the process variations include lithographic overlay and width, stress and thickness variability of a MEMS beam of the MEMS structure.

19. The method of claim 1, wherein the forming of the bumper comprises:
    forming a layer of sacrificial material on a substrate used to form a lower portion of the cavity;
    forming at least one recess within the sacrificial material;
    depositing an insulator material within the at least one recess;
    forming the MEMS beam on the sacrificial material and the insulator material; and
    venting the sacrificial material.

20. The method of claim 1, wherein the forming of the bumper comprises:
    forming a layer of sacrificial material under the MEMS beam;
    forming at least one recess within the sacrificial material;
    depositing an insulator material within the at least one recess formed in the sacrificial material; and
    venting the sacrificial material.

* * * * *